United States Patent [19]

Marston

[11] 4,270,223
[45] May 26, 1981

[54] SIGNAL NORMALIZER
[75] Inventor: Robert K. Marston, Plano, Tex.
[73] Assignee: Rockwell International Corporation, El Segundo, Calif.
[21] Appl. No.: 968,340
[22] Filed: Dec. 11, 1978
[51] Int. Cl.[3] .............................................. H04B 1/12
[52] U.S. Cl. .................................. 455/305; 328/165; 328/169; 455/235; 455/239; 455/249
[58] Field of Search ................ 325/65, 347, 408, 377, 325/473–476; 328/165, 169; 455/63, 210, 296, 303–306, 234, 235, 239, 249

[56] References Cited
U.S. PATENT DOCUMENTS
3,226,646 12/1965 Ludwig ................................ 325/475
4,177,430 12/1979 Paul ...................................... 455/306

OTHER PUBLICATIONS
"Adaptive Arrays—An Introduction"–William F. Gabriel, Proc. of the I.E.E.E., vol. 64, No. 2, Feb. 1976, pp. 239-272.

Primary Examiner—Marc E. Bookbinder
Attorney, Agent, or Firm—Richard K. Robinson; Howard R. Greenberg; H. Fredrick Hamann

[57] ABSTRACT

Both wide-band and narrow-band noise suppression can be achieved by the disclosed signal normalizer in which the properties of hard limiting and adaptive control weights are fully utilized.

10 Claims, 4 Drawing Figures

SIGNAL NORMALIZER

The Government has rights in this invention pursuant to Contract No. DAH15-73-C-0192 awarded by the Department of the Army.

BACKGROUND OF THE INVENTION

This invention relates to an apparatus and method for normalizing a received radio signal.

Traditionally, the function of a radio receiver has been to detect, amplify and decode a received radio signal, while maintaining the best possible fidelity. However, in the present day environment, signal infidelity due to the presence of intentional or unintentional interference can cause a radio receiver to malfunction. The unintentional interferences are normally the consequence of radar, man-made disturbances such as the use of appliances and other modern electrical or electronic equipment, or other similar types of radio transmissions. The intentional interferences, which are usually encountered in military situations, may be from devices that are designed to interrupt or interfere with communications systems. These devices, commonly referred to as jammers, can render a tactical military receiver inoperative. In an effort to obviate the effects of both intentional and unintentional interference, different types of methods and apparatus have been incorporated in the design of communication transmitters and receivers. These include various methods of error detection, modulation schemes, precision tuning and filtering, automatic gain control, adaptive antenna array and spread spectrum communication systems.

Many of the aforementioned methods and apparatus and combinations thereof have been used in the prior art to enhance the overall performance of a communication system and reduce the undesirable effects caused by interference with the transmission of radio signals. For example, in a recent article, "Adaptive Arrays—An Introduction", by William F. Gabriel, *Proceedings of the IEEE*, Vol. 64, No. 2, February, 1976, the use of an adaptive antenna array system was discussed for radar and communications applications. In this area, use of adaptive antenna array systems in large stationary systems are successful, especially since adaptive antenna array systems provide the ability to automatically steer nulls onto undesirable sources of interference, and thereby reduce output noise and enhance detection of the desired signal. The systems that utilize adaptive antenna array systems usually consist of an array of antenna elements and a real time adaptive receiver processor which has feedback control over the elements' weights. However, as obvious from the above-mentioned reference, adaptive antenna array systems require the application of a large servo control system for steering the antenna array.

Although adaptive antenna arrays can readily be implemented on large complex stationary radar and communication systems, they hardly lend themselves for implementation on the smaller radio receivers that, in many cases, are mobile. Because of this, there is a definite need for a method and apparatus for overcoming interference of both wide-band and narrow-band sources, especially those that are caused by amplitude modulation of a desired signal with a jamming signal that results in either a wide-band interference, narrow-band interference, or both, having a slowly varying amplitude modulation envelope. The signal normalizer, as disclosed herein, has been effective in reducing by 20 dB the effects of interference signals, especially those that are derived from a wide-band jammer.

SUMMARY OF THE INVENTION

Both wide-band and narrow-band noise suppression are achieved by the disclosed signal normalizer in which the properties of hard limiting and adaptive controlled weights are fully utilized. The input to the signal normalizer is amplified linearly, up to a predetermined level, and applied to an automatic gain control circuit. The output of the automatic gain control circuit is split into two branches, a hard limiter branch and a complex weighting control branch. The output of the two branches are compared, with the resulting error signal being amplified and fed back to the complex weighting control branch to complete a closed loop. The dynamics of the resulting closed loop attempts to null the error signal through the adaptation of the weight controls which automatically adjust the amplitude and phase of the output of the weighting control branch to provide a signal that is equal in amplitude and phase to the output of the hard limiter branch. The nulled output error signal also contains the desired signal as a result of the operation of the signal normalizer circuit which automatically suppresses any interference that is present while leaving all other signals relatively unaffected. There is a post gain control amplifier that adjusts its gain in proportion to the gain squared of the first automatic gain control circuit, thus providing a normalized received radio signal having the proper amplitude and phase relationship.

The hard limiter branch consists of an amplitude hard limiter which is effective in removing the amplitude modulated component of the composite received signal that is the result of the addition of an undesirable interfering signal to a desired signal.

The weighting control branch functions as a means for implementing the least means square algorithm, which is also known as the steepest descent control method. The signal normalizer suppresses the interference signal and leaves the other signals relatively unaffected in the nulled output signal that is provided. The implementation of this function consists of developing a complex controlling signal by the correlation of an in phase component of the received signal with the aforementioned nulled output signal and the correlation of the quadrature phase component of the received signal with the nulled output or error signal. The resulting signals are used as a weighting coefficient for the weighting devices that are present in an in phase signal line and a quadrature phase signal line. The in phase signal line is summed with the quadrature phase signal line after weighting, which results in the output signal for the weighting control branch.

Because signal normalization includes the techniques and properties of automatic gain control and post-forward gain control, there is included circuitry for implementing these functions.

Many other products and purposes of the invention will be clear from the following detailed description of the invention.

DETAILED DESCRIPTION OF THE INVENTION

Figure 1:
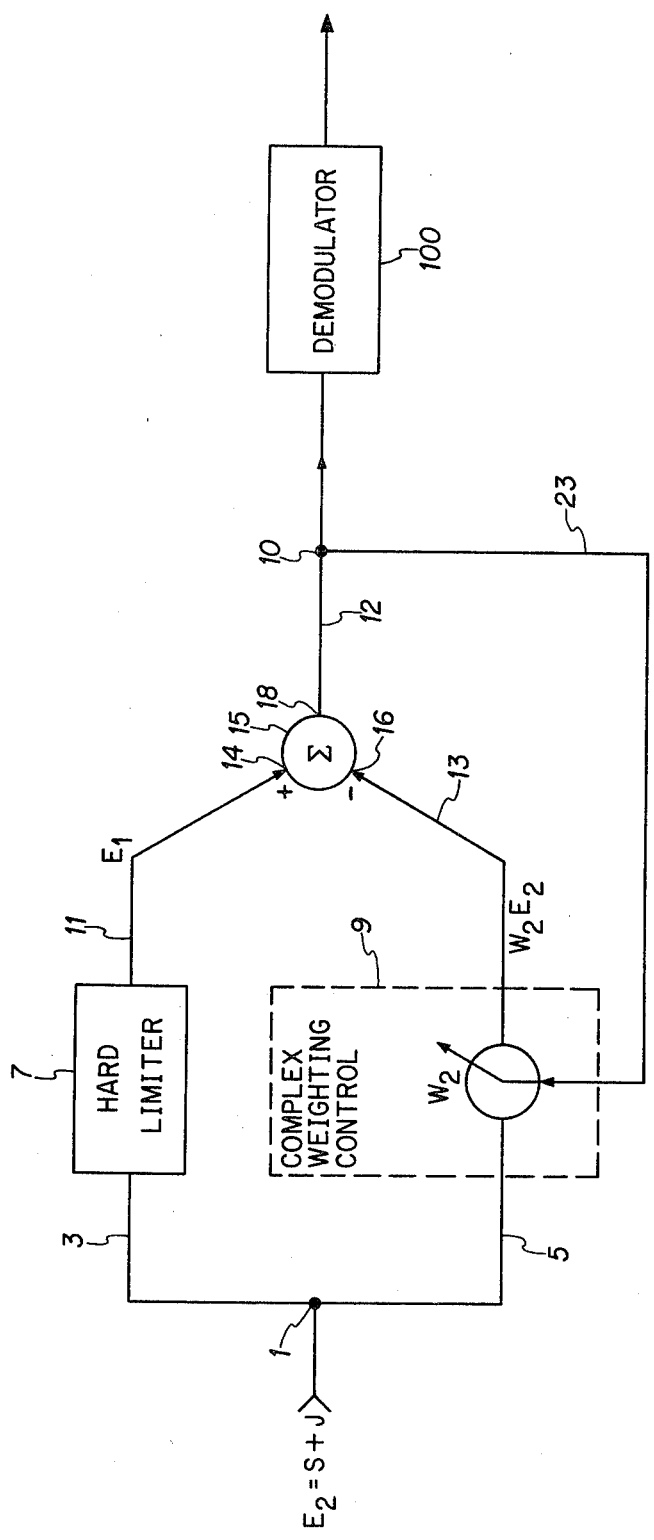
FIG. 1 is a simplified block diagram of the signal normalizer.

Referring to FIG. 1, a received radio signal is applied to junction point 1 where it is split into a hard limiter branch 3 and a weighting control branch 5. The hard limiter branch 3 includes a hard limiter 7 whose output is connected to the input terminal 14 of a summing device 15 by means of conductor 11. The purpose of the hard limiter is to strip off the amplitude modulated component on the radio frequency input signal, leaving only the frequency modulated components for summing by the summing device 15. The amplitude modulated component is present because when two or more constant envelope signals are summed, a composite signal is produced consisting of both amplitude modulated and frequency modulated components.

The radio signal that is applied to the weighting control branch 5 is conducted to a complex weighting control device 9 and the resulting output signal from the complex weighting control device is applied to the difference input terminal 16 of summing device 15 by means of conductor 13. The difference between the two branches is provided on terminal 18 of summing device 15 where it is applied by conductor 12 to junction point 10. The signal at junction point 10 is fed back into the complex weighting control device 9 by means of conductor 23 and is used as a control signal for the complex weighting control device. The signal that is present at junction point 10 is not only an error signal that controls the operation of the complex weighting control device 9, but it is also the desired normalized signal. As stated earlier, the hard limiter 7 removes the amplitude modulated component of the radio signal and its output is compared to the input signal via the weighting control device. The resulting error signal is nulled by the adaptive weighting control loop. The overall result is that the strong undesirable signal is suppressed and the weak desired signal, plus an intermodulation product term having the same level as the desired signal, is left. Subsequent processing gain of the demodulator 100, that is a device such as that disclosed in co-pending application entitled "A Baseband Differentially Phase Encoded Radio Signal Detector", filed on even date herewith, Ser. No. 968,069, filed on Dec. 11, 1978 and assigned to the assignee of the present invention, can obtain the desired transmitted information.

THEORY OF OPERATION

Figure 2:
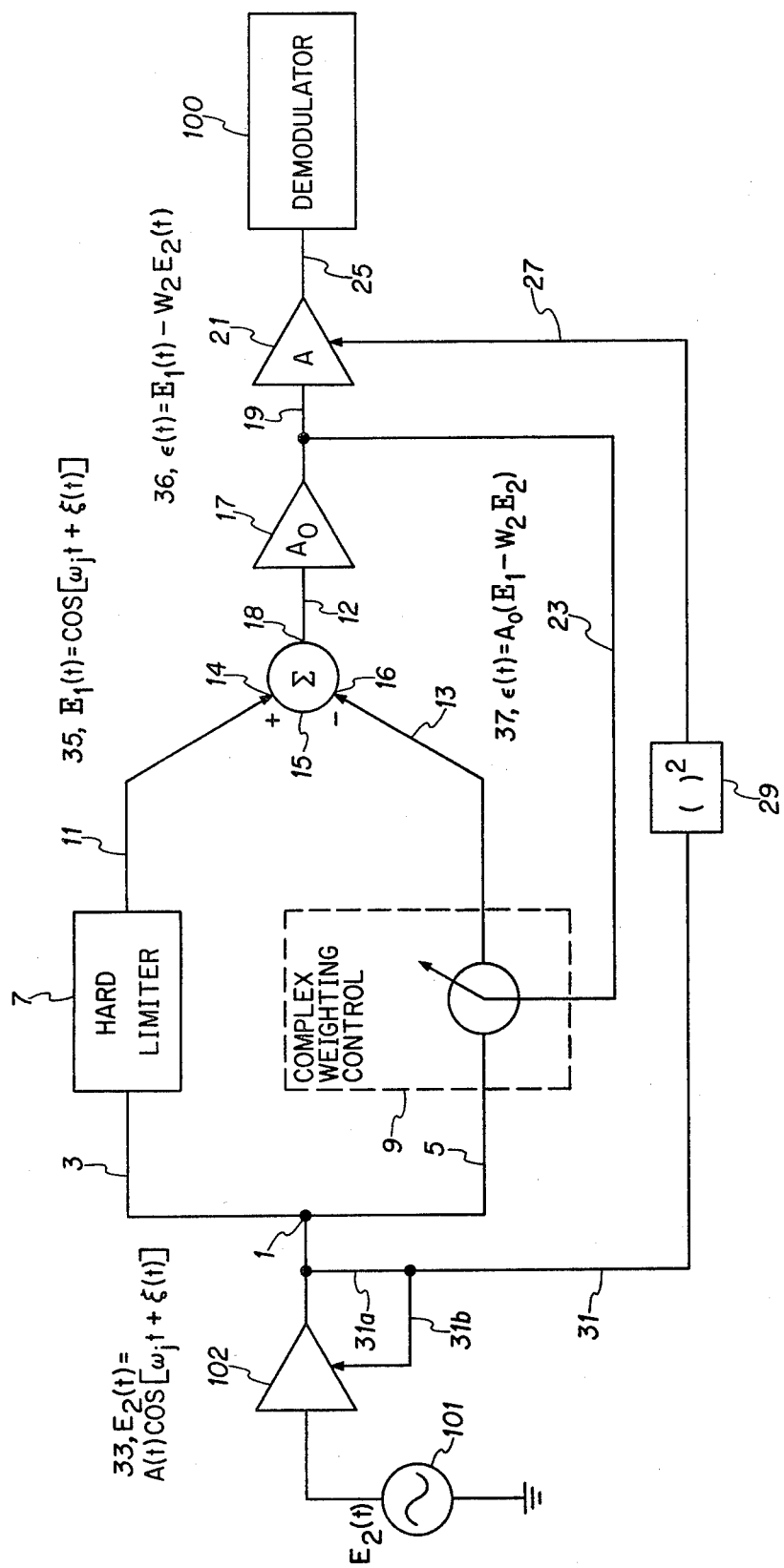
FIG. 2 is a more detailed block diagram of a signal normalizer which utilizes both AGC and post-gain controlled circuits.

The following analysis of the signal normalizer can be more readily understood when used in conjunction with the drawings of FIGS. 1 and 2. Input source 101 of FIG. 2, which can be a device such as an antenna or the front end unit, picks up and provides the composite radio signal $E_2$ which includes a jamming signal J and a weaker desirable signal S, both having a slowly varying amplitude envelope and include amplitude modulated and frequency modulated components. Thus, the input composite signal can be represented by the equation $E_2 = S + J$. For the purpose of this discussion, the input signal $E_2$ is modeled for a phase shift keying PSK receiver. S, the desirable signal, can be represented by $$S = \sum_{i=1}^{N}$$

a cos A with "a" being the amplitude of the signal S; $A = \omega_s t + \phi_i(t)$, $\omega_s$ being the carrier frequency of the desired signal and $\phi_i(t) = \pm \pi/2$ $(t - iT_c)$ is the phase component of the desired signal S. The jamming signal J can be represented by the equation $$J = \sum_{j=1}^{N_J}$$

b cos B with "b" being the amplitude of the input jamming signal and $B = \omega_j t + \theta_j(t)$, $\omega_j$ being the frequency of the undesirable signal and $\theta_j(t)$ being an arbitrary phase component.

Combining the above equation, we find that $E_2(t) = A(t) \cos(\omega_j t + \xi t)$ where the amplitude component:

$$A(t) = \sqrt{1 + \frac{2a}{b} \cos(\omega_s - \omega_j)t + (\frac{a}{b})^2}$$

It is interesting to note that the power ratio of the desirable signals to the jamming signal J is represented by $(a/b)^2$, and the phase deviation or FM component is represented by the equation $$\xi(t) = \tan^{-1} \frac{a/b \sin(\omega_s - \omega_j)t}{1 + \frac{a}{b} \cos(\omega_s - \omega_j)t}$$

Under conditions when the dominating signal is a jamming signal J, the ratio of a/b is < 1 then A(t) can be represented by $A(t) = 1 + a/b \cos(\omega_s - \omega_j)t$ and $\xi(t)$ can be represented by $\xi(t) \approx a/b \sin(\omega_s - \omega_j)t$. With this assumption, the input signal $E_2(t)$ becomes $[1 + a/b \cos(\omega_s - \omega_j)t] \cos[\omega_j t + \xi(t)]$.

The automatic gain control amplifier 102 amplifies the receive signal E(t) as represented by the equation at 33 and applies it to the hard limiting branch 3, the complex weighting control branch 5 and the automatic gain controlled feed back loop which includes conductors 31, 31a and 31b. Upon applying the amplified radio signal $E_2$ to the hard limiter 7, the AM component is essentially removed by normalization of A(t) or setting A(t) = 1 so that the output of the hard limiter 7, as it appears on conductor 11, can be represented by the equation at 35.

Under stabilized conditions where there is essentially perfect weight adaptation, the output of the summing device 15 which is the difference of the signals that appear on terminals 14 and 16 is present on terminal 18 and also on conductor 12 and it can be represented by the equation 36, which is also equal to $$\epsilon(t) = -a/2b\{\cos[\omega_s t \mp \xi(t)] + \cos[\omega_s t - 2\omega_j t \pm \xi(t)]\}.$$

The equation above includes a desired signal component $S' = -a/2b \cos[\omega_s t + \xi(t)]$ which is the original signal reduced in amplitude by a/2b and perturbed by $\xi(t)$, a slow varying deviation phase term. There is also present an intermodulation product term $S*J^2$, which is represented by $S*J^2 = -a/2b \cos[\omega_s t - 2\omega_j t - \xi(t)]$. It should be noted that the intermodulation product term is of the same amplitude as the desired signal S' and at a frequency of $(\omega_s - 2\omega_j)$.

The output of summing device 15 is applied to the error signal amplifier 17 by conductor 12. The error signal amplifier 17 has a voltage gain of $A_o$ which includes the total closed loop gain of the system and provides an output on conductor 19 and 23 that can be represented by $\epsilon(t) = A_o(E_1 - W_2 E_2)$, which is the equation shown at 37. In the equation, $E_1$ is the hard limiter signal, $E_2$ is the input signal and $W_2$ represents the weight control function as generated by complex weight control device 9.

Amplifier 21 is a post gain control gain amplifier whose gain is adjusted by the signal present on conductor 27. The input signal E(t) is passed through automatic gain control amplifier 102 whose gain is adjusted in response to the output level of the signal present on the automatic gain control feed back loop which includes conductors 31a, 31b and 31, so that the signal present at node 1 is maintained at a constant level. The signal on conductor 27 is the automatic gain control signal that is squared by squaring device 29. The output of the post gain control amplifier 21 is used to drive a demodulator circuitry 100 and is coupled to the demodulator circuit 100 by means of conductor 25.

Figure 3:
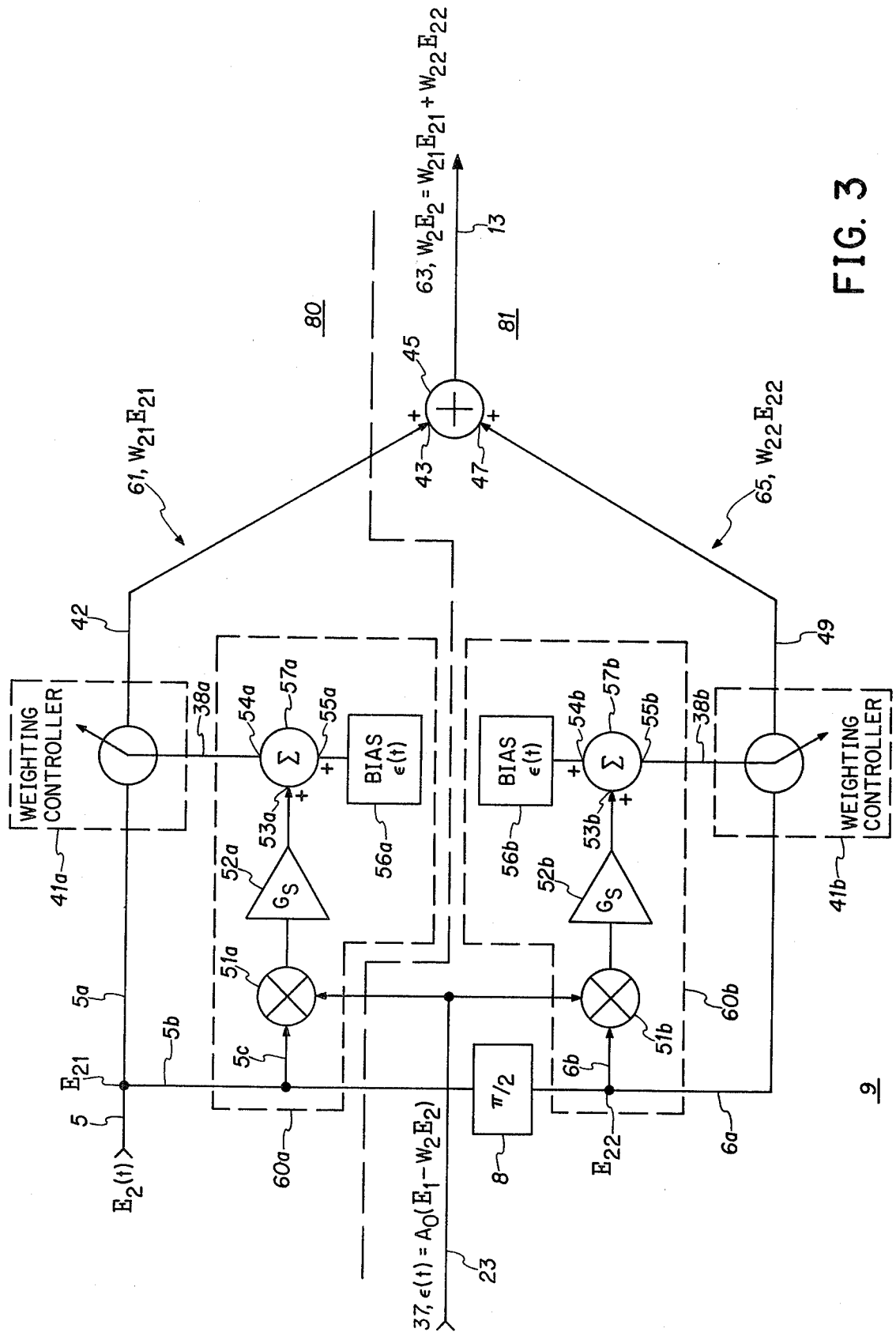
FIG. 3 is a simplified block diagram of the weighting control branch of the signal normalizer.

The complex weighting control device 9 is shown in greater detail in FIG. 3 and consists of an inphase section 80 and a quadrature phase section 81. Each section has a weighting control, 41a in the inphase section and 41b in the quadrature phase section; and a control signal generator, 60a in the inphase section and 60b in the quadrature phase section. The control signal generators 60a and 60b each consist of a mixer means 51, an amplifier means 52, a summing means 57 and a bias means 56. For explanatory purposes, each component of the control signal generator is denoted in FIG. 3 by the letter a if it is a part of the control signal generator 60a and the letter b if it is a part of the control signal generator 60b, however, as will be seen from later drawings, these components can be identical. The received signal $E_2(t)$ is carried by conductor 5a to the inphase weighting controller 41a, by conductor 5b to the control signal generator 60a and to a 90° phase shift device which establishes a quadrature relationship between the signals applied to the inphase section 80 and the quadrature phase section 81. Conductor 23 feeds the output of the error signal amplifier, as represented by equation 37 into control signal generators 60a and 60b. The control signal generator 60a correlates the error signal that is present on conductor 23 with the input signal $E_2(t)$ by applying these two signals to the input mixer device 51a which is a device such as a correlation mixer that provides an output $X_2$ which can be represented by the Laplace equation $X_2 = K^2 E_2 A_o(E_1 - W_2 E_2)$ where K is a gain constant of the mixer device 51a. The output of the mixer device 51a is passed through an amplifier 52a which has an overall gain $G_s$ and into summing device 57a. The summing device 57a sums the correlation mixed output with a quiescent steering bias developed by bias means 56a for developing the control signal $W_{21}$ that is present on terminal 54a of the summing device 57a. The control signal $W_{21}$ is applied to weighting controller 41a means of conductor 38a for generating the in phase weight control signal $W_{21}E_{21}$ which is applied to summing device 45 by means of conductor 42. The output of the weighting control device 41a is represented by the equation at 61.

After performing a 90° phase shift upon the input signal $E_2(t)$, $E_{22}(t)$, which is a quadrature phase signal $E_2(t)$ or $E_{22}$ in Laplace notation, is applied to the quadrature mixer 51b. The quadrature circuitry that is contained in the quadrature section 81 is identical to that contained in the in phase branch 80 as was discussed above. The weight control signal $W_{22}$ as is shown at 65 is present on conductor 49 and input terminal 47 of summing device 45. The Laplace equation at 63 represents the output of summing device 45. $W_2$ is the weight that was multiplied by the input signal $E_2$ and is equal to:

$$W_2 = \frac{S + W_o}{S + W_o(G+1)} B_2 + \frac{GW_o}{S + W_o(G+1)} \frac{E_1}{E_2}$$

$E_2$, of course, is the Laplace equation for the input signal, $E_1$ is equal to the hard limiter signal, G is the total loop gain and is:

$$G = K^2 |E_2|^2 A_o G_o$$

$G_o$ is the DC voltage gain of the weighting control circuit, $W_o$ is equal to the low pass cutoff of the low pass filter, that is, for purposes of FIGS. 2 and 3, included within the error signal amplifier 17 and $B_2$ is equal to the quiescent steering bias. It is obvious from the above equation that the two components that control the response of the weighting control circuitry are the quiescent steering bias $B_2$ and the ratio of the two signals $E_1$ and $E_2$. The equation for the overall suppression D is $D = 1/G + 1$ which shows that the amount of steady state suppression is dependent on only the total loop gain parameter G. The time response $\tau$ of the adaptation loop is $$\tau = \frac{1}{W_o(G+1)}$$

where $W_o$ as stated earlier is the low pass cutoff frequency and G is the total loop gain.

DESCRIPTION OF THE PREFERRED EMBODIMENT

Figure 4:
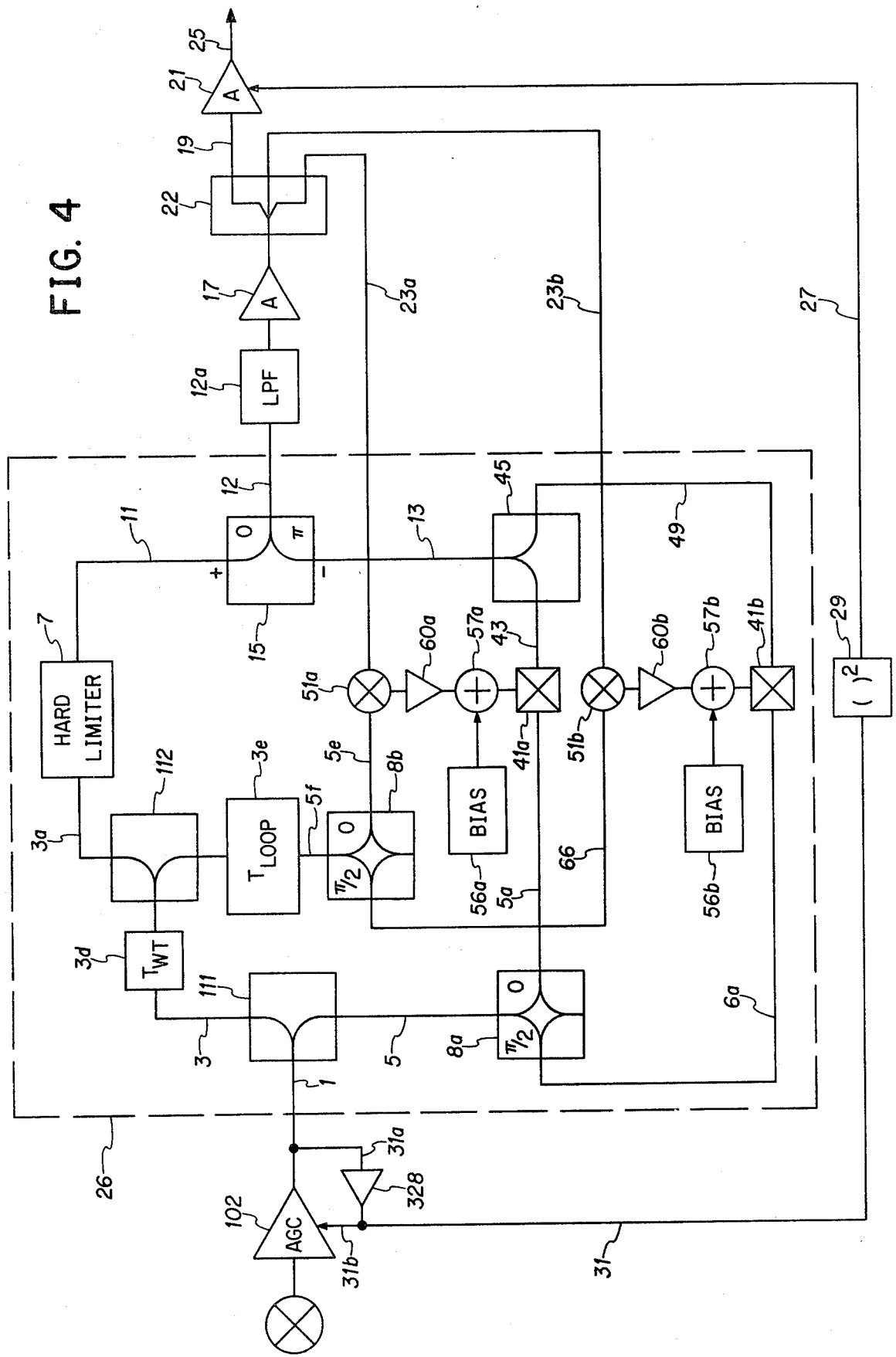
FIG. 4 is a more detailed block diagram of the signal normalizer of FIG. 3.

A function diagram of a signal normalizer that was designed to operate at a frequency of 300 MHz with a bandwidth of ±60 MHz is shown in FIG. 4. In this figure, the output of automatic gain control amplifier 102 is applied to normalizing circuit 26 which has as its input, a hybrid power splitter 111 that divides the input signal into two output signals. One signal is applied to conductor 3 for providing the signal to the hard limiter 7 by way of power splitter 112 which also provides the input signal for the quadrature hybrid device 8b. The other output of power splitter 111 is connected to quadrature hybrid device 8a by means of conductor 5. The hybrid power splitters 111 and 112 are hybrid devices that are commercially available. Quadrature hybrid devices 8a and 8b perform a 90° phase shift upon the signal that is present on conductors 5 and 5f, respectively.

Because of the inherent delays in the operation of the the quadrature hybrids 8a and 8b, the power splitters 111 and 112 and delays in other circuit components such as hybrids, combiners, low pass filters, etc., it is necessary to ensure a proper phase relationship between the hard limiter branch 3 and the weighting control branch 5. Therefore, there are delay lines 3d and 3e present in the normalizing circuit 26.

As mentioned earlier, the weighting control branch is a complex branch and has an inphase and a quadrature phase component, the operation of which is identical to that discussed in FIG. 3. The hybrid device 8b provides the input signal to mixed device 51a by means of conductor 5c and the phase quadrature of the input signal to mixing device 51b by means of conductor 6b. Similarly, the quadrature hybrid device 8a provides the input signal to the weighting control device 41a by means of conductor 5a and the quadrature phase of the input signal to the weighting control device 41b by means of conductor 6a.

The summing device 45 is a hybrid summer as shown, the output of which is applied to a summing device 15 that sums the output of the hard limiter 7 that is present on conductor 11 with the output of complex weighting control summing device 45 that is present on conductor 13 and provides the summed output on conductor 12. To eliminate the generated noise that under normal conditions would be produced by the operation of the normalizing circuit 26, there is present on conductor 12 a low pass filter means 12a which removes undesirable out of band signals prior to amplification by error signal amplifier 17. Error signal amplifier 17 drives a power splitter 22 which has three outputs that are connected to conductors 23a, 23b and 27. The outputs 23a and 23b of the power splitter 22 are the feedback loops represented as conductor 23 in FIG. 2 and are used to drive the inphase mixer means 51a and the quadrature phase mixer means 51b, respectively. Conductor 19 joins the other output of the power splitter to amplifier 21 which is the post gain control amplifier and it provides the normalized signal to the rest of the receiver by means of conductor 25. It has been found that the output of the post gain control amplifier 21 is also an excellent place for the implementation of RF level detections (not shown).

The automatic gain control loop and the post gain control circuit consist of conductor 31a which picks up the amplified signal that was amplified by amplifier 102 and is at node 1. The amplified signal at 31a is envelope detected and amplified by amplifier 328, the output of which is connected to conductors 31a and 31b. The automatic gain control amplifier 162 is controlled by the output of amplifier 328. The output of amplifier 328 is also passed through a squaring device 29 and connected to the post gain control amplifier 21 by means of conductor 27. The feedback loop that includes amplifier 328 is used to control the AGC amplifier 102 and also drive the squaring device 29, the output of which controls the post gain amplifier 21. The post gain amplification, of course, is related to the input signal by $(A_{AGC})^2$ which is the gain squared of the automatic gain control amplifier.

The disclosed signal normalizer was used in a mobile radio to improve the wideband interference rejection. Although the radio, prior to the addition of the signal normalizer circuit, was configured such that it had greater than 60 dB rejections of narrow-band interference and 30 dB rejections of wide-band interference, the addition of the signal normalizer provides an additional 20 dB of wide-band rejection. The signal normalizer during operation senses the composite power level in the IF circuitry and, when this level reaches the threshold of the signal normalizer, it switches itself into the IF signal phase and suppresses the interfering signal.

Since the IF is inside the overall receiver AGC loop, it is important to keep the signal normalizer gain at the desired signal constant regadless of the power level of the interference. The post gain control stage in the signal normalizer performs these functions.

The reason for the automatic gain control circuit is to maintain the composite signal level at a constant level feeding the normalizing circuit 26 to achieve improved performance of the overall loop. The post gain control circuit level is approximately +5 dB and is field adjustable to optimize performance. The maximum gain of the automatic gain control circuit is 45 dB, being determined by the input desired signal level of −60 dBm and the maximum allowable jammer of −15 dBm. The delay associated with the circuit was very flat and well defined within a nano second from 200 to 400 MHz. For the 300±60 MHz bandwidth associated with the circuit, the error was within ±6° for up to 20 dB of attenuation. This amount of error is a maximum allowable for 20 dB of suppression. Actually, an increased error of over 6° for attenuation levels beyond about 15 dBm is of little importance since any contribution resulting from this error will contribute little to the overall signal output of the summing junction that appears on conductor 12. The two correlation mixers 51a and 51b operate in the nonsaturating mode to develop the error signals driving the current control attenuators.

The amplifiers 52 and both the phase control signal generator 60a and the quadrature phase control signal generator 60b determine the response of the loop. The delay 3e ensure the arrival of the inputs to the mixers 51a and 51b at the same time and the other delay 3d performs similar functions on the signals arriving at the summing means 15 from the limiter and complex controlled weighting circuits.

The post gain control amplifier 21 must maintain the output desired signal level at a constant level. Since both the automatic gain control amplifier 102 and the post gain control amplifier 21 stage contains single pin diodes current control attenuator type amplifiers, their attenuation versus current is nonlinear. With $R(I)=C/I^x$ where $R(I)$ is the resistance of the diode and since the attenuation of the signal power varies directly with the input of the jamming signal, the control voltage driving the POST gain control attenuator from the AGC error line must be shaped so as to maintain a constant signal power level at the output of the signal normalizer.

Many modifications in the above-described embodiments of the invention can, of course, be carried out without departing from the spirit and scope of the invention. Accordingly, the invention is intended to be circumscribed only by the scope of the appended claims.

What is claimed is:

1. A signal normalizer for a radio receiver comprising:
    first circuit means for providing a first signal that results from removing essentially all AM components present on a received signal by the first circuit means, the AM component being the component present as a result of combining a desirable signal with an undesirable signal;
    second circuit means for providing a second signal;
    first arithmetic means for providing a third signal that results from an amplitude comparison of the first and second signals;

means for providing a received signal to said first and second circuit means; and feedback path means for connecting the third signal to the second circuit means whereby the second circuit means in response to the received signal and the third signal provides the second signal, said first arithmetic means subtracting said second signal amplitude from the first signal which as a result of this subtraction the third signal is a normalized output signal.

2. The signal normalizer according to claim 1 wherein the first circuit means comprises a hard limiter means.

3. The signal normalizer according to claim 1 wherein the second circuit means comprises:
  first and second controllable attenuator means;
  first and second correlator means;
  means for applying the received signal to the first controllable attenuator means and said first correlator means;
  means for applying a signal in quadrature with the received signal to the second controllable attenuator means and the second correlator means;
  means for conducting the third signal to the first and second correlator means;
  means for providing a first controlling signal to the first controllable attenuator, the first controlling signal resulting from correlating the received signal and the third signal by the first correlator means;
  second arithmetic means for providing the second signal which is an attenuated combination of a fourth and fifth signal;
  means for providing the fourth signal to the second arithmetic means wherein the fourth signal is the output of the first controllable attenuator in response to the first controlling signal and the received signal;
  means for providing a second controlling signal to the second controllable attenuator, the second controlling signal resulting from the correlation of the quadrature received signal with the third signal; and
  means for providing the fifth signal to the second arithmetic means, the fifth signal being the output of the second controllable attenuator in response to said second controlling signal and said quadrature signal.

4. The signal normalizer according to claim 3 wherein each means for providing the first and second controlling signals to the first and second controllable attenuators, respectively, comprises:
  a first adjustable bias means located between the first correlator means and the first controllable attenuator; and
  a second adjustable bias means located between the second correlator means and the second controllable attenuator.

5. The signal normalizer according to claim 1 further comprises:
  an automatic gain control system including;
  an input circuit means having an adjustable gain;
  a gain control signal circuit means electrically connected to the output of said input circut means for providing a gain control signal;
  a squaring circuit means electrically connected to said gain control signal circuit means for squaring of said gain control signal;
  an output circuit means having an adjustable gain;
  means for connecting said received signal to said input circuit means;
  means for connecting the output of said input circuit means to said first and second circuit means,
  means for connecting the output of said first arithmetic means to said output circuit means;
  means for connecting said gain control signal to said input circuit means whereby said input circuit means in response to said gain control signal and said received signal maintains the output of said input circuit at a constant level, and
  means for connecting the output of said squaring circuit means to said output circuit means whereby said output circuit's gain is controlled by the gain control signal squared.

6. A method for normalizing a received signal containing interference comprising:
  removing an AM component present on the received signal in a first path to provide a first output signal;
  passing the received signal through a second path having included therein a complex weighting control device to produce a second output signal;
  amplitude comparing the first output signal to the second output signal to obtain an error signal;
  controlling a complex weighting control device to provide, in response to the error signal and the received signal, the second output signal;
  said comparing step including subtracting the second output signal amplitude from the first output signal amplitude to obtain the error signal whereby said error signal is a normalized output signal with any interference present in the received signal being suppressed.

7. The method for normalizing a received signal according to claim 6 wherein the step of removing the AM component present in said received signal comprises passing said signal through a hard limiting circuit.

8. The method of normalizing a received signal according to claim 6 wherein the step of passing the received signal through a second path having included therein a complex weighting control device comprises:
  transforming the received signal into a complex signal having an inphase component and a quadrature phase component;
  generating an inphase weighting control signal;
  generating a quadrature weighting control signal;
  passing the inphase component through a weighting control device responsive to the inphase weighting control signal and obtaining thereby, a weighted inphase component;
  passing the quadrature phase component through a weighting control device that is responsive to the quadrature weighting control signal to obtain a weighted quadrature component; and
  arithmetically combining the weighted quadrature component with the weighted inphase component.

9. The method for normalizing a received signal according to claim 8 wherein the step of generating an inphase weighting control signal and the step for generating a quadrature phase weighting control signal comprises:
  mixing the inphase component with the error signal to generate the inphase weighting control signal and mixing the quadrature phase component with the error signal to obtain the quadrature weighting control signal.

10. The method for normalizing a received signal according to claim 9 wherein the step for generating the inphase weighting control signal and the quadrature phase weighting control signal, further comprising:

summing the inphase weighting control signal with a bias signal to obtain an inphase bias weighting control signal; and summing the quadrature phase weighting control signal with a quadrature bias signal to obtain a quadrature bias weighting control signal.

* * * * *